United States Patent
Silverman

(10) Patent No.: US 9,655,280 B1
(45) Date of Patent: May 16, 2017

(54) MULTI-DIRECTIONAL FORCE GENERATING LINE-REPLACEABLE UNIT CHASSIS BY MEANS OF A LINEAR SPRING

(71) Applicant: Lockheed Martin Corporation, Bethesda, MD (US)

(72) Inventor: Alexander J. Silverman, Wilmington, DE (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/985,757

(22) Filed: Dec. 31, 2015

(51) Int. Cl.
*H05K 7/20* (2006.01)
*H01L 23/473* (2006.01)

(52) U.S. Cl.
CPC .................. *H05K 7/2039* (2013.01)

(58) Field of Classification Search
CPC . G06F 1/181–1/182; H05K 7/20218–7/20381; H05K 7/20409–7/20418; H05K 7/20009–7/202; H01L 23/46–23/3677
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 3,688,159 A * | 8/1972 | Robbins | H01L 23/4006 174/16.3 |
| 3,826,957 A * | 7/1974 | McLaughlin | H01L 23/427 165/104.21 |
| 4,338,652 A * | 7/1982 | Romanczuk | H01L 23/4012 257/658 |
| 4,769,744 A * | 9/1988 | Neugebauer | H01L 23/32 257/719 |
| 5,426,565 A * | 6/1995 | Anderson | H01L 23/4006 257/719 |
| 5,431,582 A | 7/1995 | Carvalho et al. | |
| 5,631,808 A | 5/1997 | Collins, III | |
| 6,532,154 B2 * | 3/2003 | Eady | H05K 7/1424 257/727 |
| 7,322,843 B1 | 1/2008 | Lee et al. | |
| 8,240,648 B1 | 8/2012 | Pluymers et al. | |
| 8,456,846 B2 | 6/2013 | Mosier et al. | |
| 8,854,818 B1 | 10/2014 | Angelucci | |
| 9,144,178 B2 | 9/2015 | Arvelo et al. | |
| 2002/0089056 A1 * | 7/2002 | Eady | H05K 7/1424 257/712 |
| 2010/0020514 A1 * | 1/2010 | Lee | H05K 7/1404 361/801 |
| 2011/0292604 A1 * | 12/2011 | Janes | H05K 7/20909 361/695 |
| 2011/0304985 A1 * | 12/2011 | Rittner | H01L 23/3735 361/688 |

(Continued)

FOREIGN PATENT DOCUMENTS

WO    2015/016808 A1    2/2015

*Primary Examiner* — Anthony Haughton
*Assistant Examiner* — Razmeen Gafur
(74) *Attorney, Agent, or Firm* — Howard IP Law Group, P.C.

(57) ABSTRACT

A system for selectively engaging a plurality of electronics modules with a respective heat sink is provided. The system includes a spring element and a force generation system for selectively applying a force on the spring element. The spring element, in response to the force, is configured to generate a first resultant force on a first electronics module in a first direction generally parallel to the direction of said force applied by the force generation system, a second resultant force on a second electronics module in a second direction, the second direction different from the first direction, and a third resultant force on a third electronics module in a third direction, the third direction generally opposite that of the second direction.

20 Claims, 8 Drawing Sheets

Relaxed State

(56) References Cited

U.S. PATENT DOCUMENTS

| | | | | |
|---|---|---|---|---|
| 2013/0003311 A1* | 1/2013 | Privitera | H01L 23/36 | 361/718 |
| 2013/0050947 A1* | 2/2013 | Kadoguchi | H01L 23/051 | 361/715 |
| 2013/0083486 A1* | 4/2013 | Heo | H01L 23/4093 | 361/709 |
| 2013/0094149 A1* | 4/2013 | Kataoka | H01L 23/4006 | 361/709 |
| 2013/0176679 A1* | 7/2013 | Anderl | H01L 23/4093 | 361/679.47 |
| 2013/0335918 A1* | 12/2013 | Tachibana | H05K 5/0213 | 361/689 |
| 2014/0029200 A1* | 1/2014 | Annacchino | H05K 7/20936 | 361/700 |
| 2014/0118932 A1* | 5/2014 | Harmelink | H05K 7/20254 | 361/689 |
| 2014/0168900 A1* | 6/2014 | Korich | H05K 7/1432 | 361/709 |
| 2014/0247554 A1* | 9/2014 | Sharma | H05K 7/1432 | 361/695 |
| 2014/0285973 A1* | 9/2014 | Hong | H05K 5/0221 | 361/709 |
| 2014/0293533 A1* | 10/2014 | Doering | G06F 1/20 | 361/679.54 |
| 2014/0313673 A1* | 10/2014 | Akamatsu | H05K 7/2039 | 361/706 |
| 2014/0321057 A1* | 10/2014 | Cummings | H01L 31/02021 | 361/699 |
| 2014/0355212 A1* | 12/2014 | Campbell | H05K 7/20236 | 361/699 |

* cited by examiner

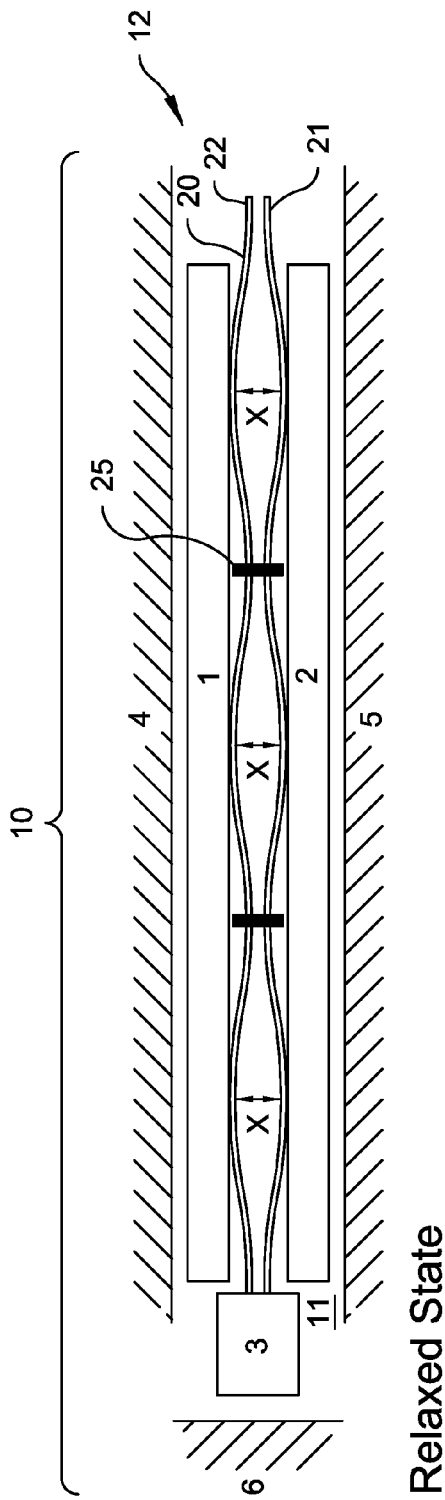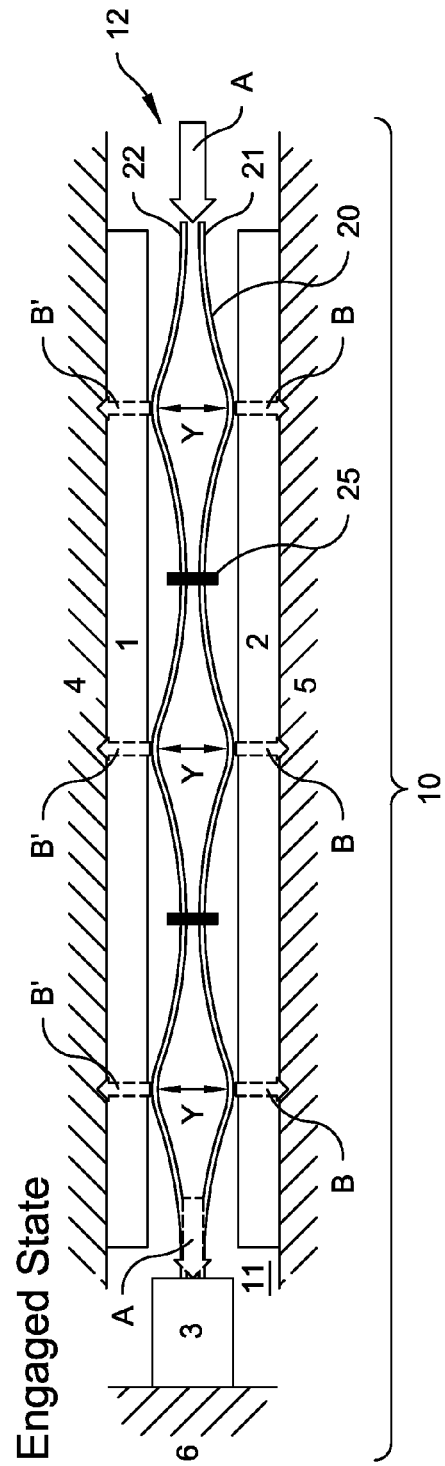

MULTI-DIRECTIONAL FORCE GENERATING LINE-REPLACEABLE UNIT CHASSIS BY MEANS OF A LINEAR SPRING

FIELD OF THE INVENTION

The present invention relates to cooling and retaining systems for electronic components, and more specifically, to systems for retaining and cooling line-replaceable units (LRUs).

BACKGROUND

Modern electronic systems are often implemented using removable modules containing electronic components. These electronic modules, or LRUs, may include printed wire/circuit boards (PWBs/PCBs) or "circuit cards" or collections thereof, and provide quick replacement or repair, simplified system packaging and reduced cost. In some applications, these modules comprise high-power electronic components which generate large amounts of heat during operation. In order to prevent damage and extend the service life of these components, separate conductive cooling systems are often implemented into these systems. These cooling systems may comprise, for example, heat sinks or heat exchangers embodied as heat-conducting chassis or frames which may be air or liquid-cooled, or may simply comprise a large thermal capacity.

In traditional systems, LRUs are generally "edge-cooled", or held on their ends within slots formed on opposing "cold walls" or "cold plates" of a chassis. Such edge-cooled arrangements suffer from several significant drawbacks. For example, cooling is relatively inefficient, as contact with the cold walls occurs only at the edges of the units. In other systems, a major surface of an LRU is placed in contact with a cooling surface of a cold plate, improving cooling performance compared to edge-cooled arrangements. However, due to the increasingly dense packaging of electronic components in modern systems, achieving this type of cooling in space-limited environments requires thermally mating LRUs to multiple cooling surfaces that are oriented in multiple discrete directions. These arrangements require the application of forces acting normal to each of these surfaces, and thus, forces acting in multiple directions, in order to maintain sufficient contact pressure.

Improved systems and methods for LRU retention and cooling in these systems are desired.

SUMMARY

According to one embodiment, a system for selectively engaging each of a plurality of electronics modules with a respective cooling surface of a cooling system is provided. The system includes a frame, at least one spring element, and a force generation system for selectively applying and maintaining a force on the spring element. The spring element, in response to said application of force, is configured to compress in length and expand in width for generating a plurality of resultant forces for biasing each of the plurality of electronics modules in a discrete direction.

In another embodiment, a cooling system for an electronics module is provided. The system includes a first heat sink defining a first cooling surface, a second heat sink defining a second cooling surface oriented generally parallel to and opposing the first cooling surface of the first heat sink, and a third heat sink defining a third cooling surface oriented generally perpendicular to the first cooling surface and the second cooling surface. The first cooling surface, the second cooling surface, and the third cooling surface at least partially define an opening. The system further includes an electronics module retaining chassis configured to be removably inserted into said opening. The retaining chassis includes a frame for at least one of housing and supporting first, second and third electronics modules, a spring element supported within the frame, and a force generation system for selectively applying a force on the spring element. The spring element, in response to said application of force, is configured to generate: 1) a first force for urging said first electronics module in a first direction into contact with said first cooling surface of said first heat sink; 2) a second force for urging said second electronics module in a second direction into contact with said second cooling surface of said second heat sink, and 3) a third force for urging said third electronics module in a third direction into contact with said third cooling surface of said third heat sink.

Another embodiment of the present disclosure includes a system for selectively engaging each of a plurality of electronics modules with a respective heat sink. The system comprises a spring element, and a force generation system for selectively applying and maintaining a force on the spring element. The spring element, in response to said force, is configured to generate: 1) a first resultant force on a first electronics module in a first direction generally parallel to the direction of said force applied by the force generation system; 2) a second resultant force on a second electronics module in a second direction, the second direction different from the first direction; and 3) a third resultant force on a third electronics module in a third direction, the third direction generally opposite that of the second direction.

BRIEF DESCRIPTION OF THE DRAWINGS

FIGS. 1A and 1B are simplified schematic diagrams illustrating the function of a linear bending spring within an LRU cooling system according to an embodiment of the present disclosure.

DETAILED DESCRIPTION

Figure 2:
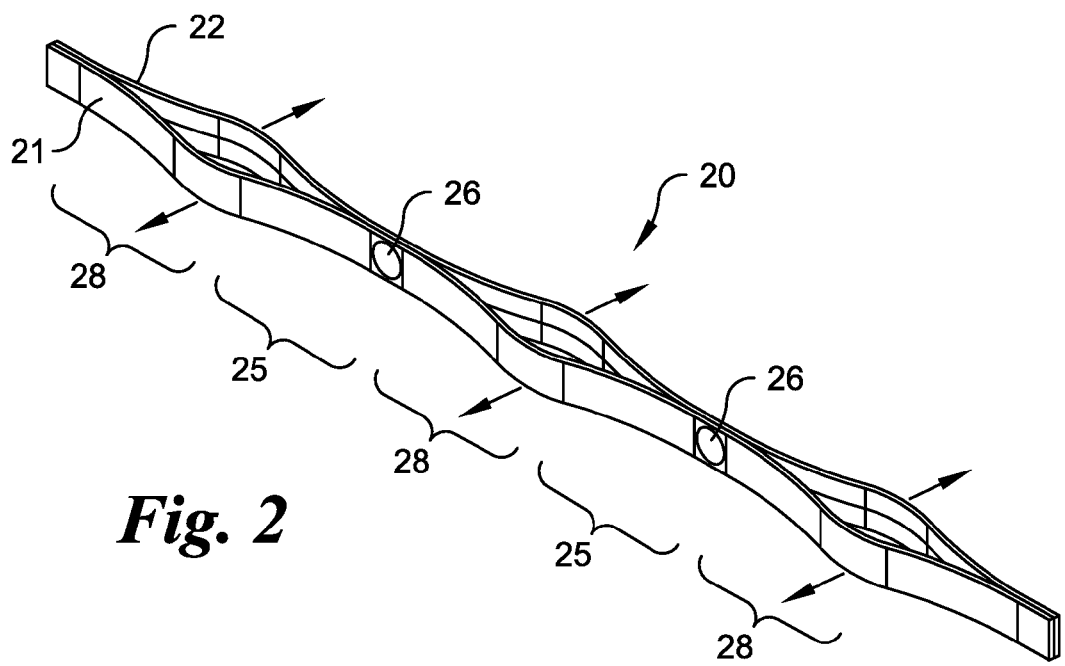
FIG. 2 is an isometric view of a linear bending spring according to an embodiment of the present disclosure.

It is to be understood that the figures and descriptions of the present invention have been simplified to illustrate elements that are relevant for a clear understanding of the present invention, while eliminating, for purposes of clarity, many other elements found in LRU retaining and/or cooling systems. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure include systems and methods for retaining and cooling LRUs which offer improved mechanical and thermal characteristics compared to systems of the prior art. Embodiments provide the ability to efficiently cool a plurality of LRUs (e.g. three or more) in a space-constrained environment while providing consistent contact pressure between each LRU and one of a plurality of cold plates, as well as facilitate quick installation and removal the LRUs.

One embodiment of the present disclosure includes a cooling system having a plurality of cold plates (e.g. liquid-cooled cold plates). The cold plates may be arranged so as to at least partially define an aperture or opening into which a removable LRU retaining chassis according to an embodiment of the present disclosure may be inserted. In one embodiment, the cooling system comprises at least three cold plates, including two lateral cold plates arranged generally parallel to one and other, and a rear cold plate arranged proximate the ends of the lateral cold plates and generally perpendicular thereto. The lateral and rear cold plates at least partially define an aperture configured to accept a removable LRU retaining chassis. In another embodiment, the lateral and rear cold plates may be replaced by a single cooling unit or single multi-sided cold plate defining said aperture.

A removable LRU retaining chassis, or floating LRU chassis, according to embodiments of the disclosure includes a support frame, one or more multi-directional bending spring elements, and a force generation assembly. The LRU retaining chassis is configured to support or otherwise house a plurality of LRUs (e.g. three). In one embodiment, the force generation assembly includes a bracket having a threaded aperture configured to receive and threadably engage with a threaded element or member (e.g. a threaded rod, screw or other fastener). The bracket may be fixedly mounted to, for example, a portion of the cooling system (e.g. a frame retaining the cold plate(s)), such that the position of the bracket is fixed upon installation of the LRU retaining chassis relative to the cooling system. The force generation assembly is configured to apply a compressive force on the one or more spring elements. Each spring element, in turn, compresses in length and expands in width. Resultant forces created by the compressive force and accompanying expansion of the spring element act in multiple distinct directions (e.g. three directions), bearing on each of the LRUs supported or housed by the LRU retaining chassis simultaneously. This arrangement enables consistent contact across LRUs surfaces against the cold plates for optimum heat conduction.

Referring generally to FIGS. 1A and 1B, a simplified representation of an embodiment of the present disclosure is shown. An LRU cooling system 10 is provided, including a plurality of cold plates 4,5,6. Cold plates 4,5,6, may also be embodied as a single cold plate having multiple cooling surfaces oriented in the illustrated manner. Cold plates 4,5,6, are arranged so as to at least partially define an opening or aperture 11 into which a removable LRU retaining chassis 12 according to an embodiment of the present disclosure (only portions of which are illustrated) may be inserted. In one embodiment, cold plate 4 and cold plate 5 include cooling surfaces that are oriented generally parallel to one another and define the lateral cooling surfaces of aperture 11. Cold plate 6 is arranged proximate the ends of cold plates 4,5 and comprises a cooling surface oriented generally perpendicular to the cooling surfaces of cold plates 4,5 for defining a rear cooling surface of aperture 11.

LRU retaining chassis 12 is configured to support or house a plurality of LRU 1,2,3 arranged generally adjacent to a respective cooling surface of one of cold plates 4,5,6. Specifically, LRU 1 and LRU 2 are mounted on or within chassis 12 such that they are oriented generally adjacent to and parallel with respective cooling surfaces of cold plates 4,5 when LRU retaining chassis 12 is inserted into aperture 11. LRU 3 may be fixed, or otherwise arranged proximate, to an end of chassis 12 and generally adjacent to the rear cooling surface defined by cold plate 6 when LRU retaining chassis 12 is inserted into aperture 11.

As set forth above, in order to maintain sufficient cooling of LRUs 1,2,3, pressure must be applied to each LRU, urging each LRU into contact with a respective cold plate 4,5,6. According to embodiments of the present disclosure, these forces may be generated via one or more spring elements, embodied in FIGS. 1A and 1B as a linear bending spring or spring element 20. Spring element 20 comprises two spring halves 21,22 each having a generally elongated profile. As shown in greater detail with respect to FIG. 2, each spring half 21,22 may comprise an undulating, sinusoidal (e.g. half sine wave), or otherwise wave-like profile of alternating concavity along its length. Spring halves 21,22 may be aligned such that spring element 20 defines alternating first sections 25, wherein first halves 21 and second halves 22 are in close proximity to (e.g. abutting) one another, and second sections 28, wherein first halves 21 and second halves 22 are aligned such that openings or gaps are defined therebetween.

Second sections 28 may be referred to herein as deformation zones or deformation areas 28. By virtue of the profile of first and second spring halves 21,22, in these deformation zones 28 the bending stiffness of spring element 20 is reduced in response to an axial or compressive force placed thereon. In this way, elastic deformation of spring element 20 in the indicated directions is encouraged in zones 28. As illustrated, fasteners 26 may be utilized to connect springs halves 21,22 to one another in first sections 25, further encouraging the isolation of the deformation of spring element 20 to deformation zones 28.

Referring again to FIGS. 1A and 1B, FIG. 1A illustrates spring element 20 in a relaxed or uncompressed state, wherein little or no pressure is being exerted by spring element 20 on LRUs 1,2,3. With respect to FIG. 1B, an applied force on an end of spring element 20 in the indicated axial direction A results in the illustrated resultant forces being applied to each of LRUs 1,2,3. Specifically, a force of sufficient magnitude in the axial direction A placed on the end of spring element 20 biases spring element 20 and thus LRU 3 in the axial direction, and into contact with cold plate 6. Continued axial force applied to spring element 20 causes the elastic deformation of spring element 20 in the illustrated manner (i.e. the widening of spring element 20 in deformation zones 28, FIG. 2). Specifically, the width of spring element 20 is increased from a width "X" (FIG. 1A) to a greater width "Y" (FIG. 1B) in a direction generally perpendicular to the longitudinal or axial direction of spring element 20. This change in width results in the generation of lateral forces in the indicated directions B,B' by spring element 20 (i.e. forces perpendicular to the axial direction of spring element 20) acting on LRUs 1,2 and biasing each into contact with a respective cold plate 4,5. Thus, spring element 20 utilizes the application of a force acting in a single direction for creating resultant forces acting in multiple directions (e.g. the three discrete directions A,B,B' illustrated in FIG. 1B).

Spring element 20, including spring element halves 21,22, may be constructed of metal such as beryllium copper or stainless steel, and may be fabricated using suitable techniques, including stamping or other sheet metal forming processes. Likewise, springs elements may be constructed out of other materials, such as composites or polymers capable of the above-described elastic deformation.

While contoured spring profiles are used to create the above-described deformation zones in the embodiment of the spring element of FIG. 2, it should be understood that spring elements of other construction types may be implemented into embodiments of the present disclosure for achieving similar results. For example, halves of a two-part spring element may be formed of varying thickness, or with relief cuts strategically placed, along their lengths. A reduction in the stiffness of the spring element in these areas of thinner cross section, or in areas where reliefs have been formed, may be used to create similar controlled elastic deformation zones.

Figure 3:
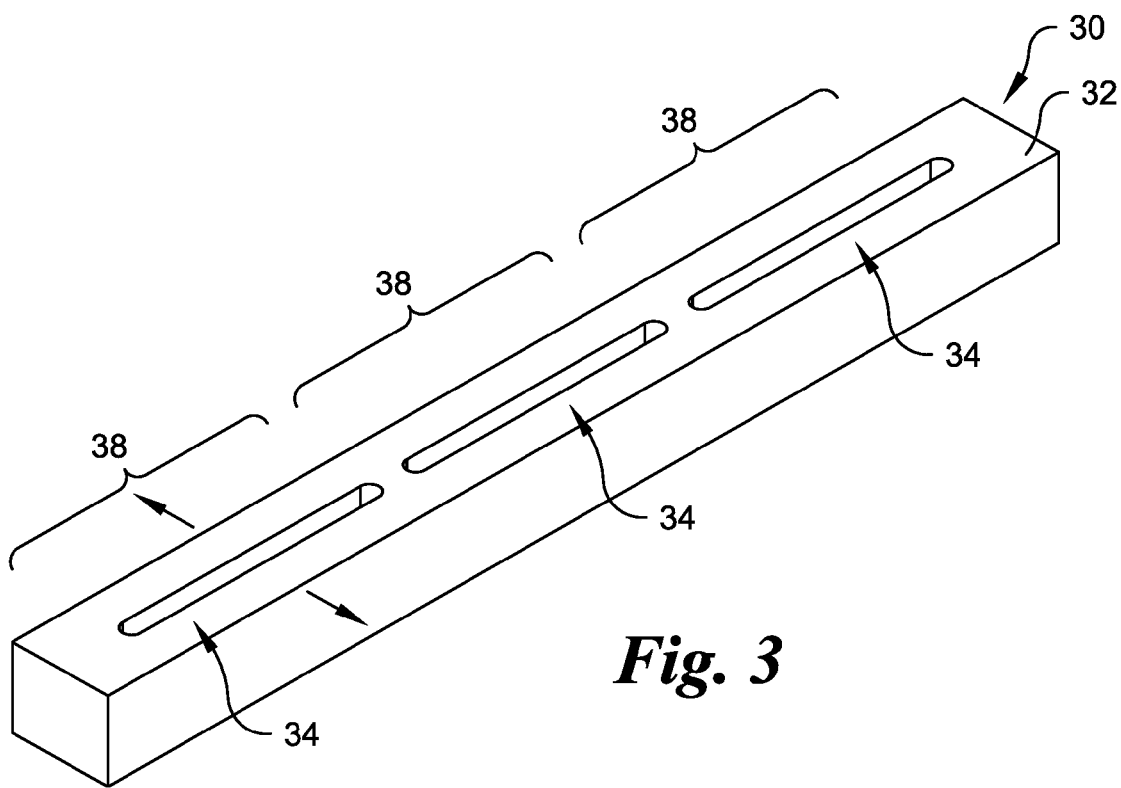
FIG. 3 is an isometric view of a linear bending spring according to another embodiment of the present disclosure.

By way of additional non-limiting example, FIG. 3 shows an alternate embodiment of a linear bending spring or spring element according to the present disclosure. Spring element 30 comprises an elongated monolithic body 32 and may be formed from a piece of resilient material, such as rubber or other polymeric materials. Slots or reliefs 34 may be formed (e.g. molded or machined) in body 32 so as to promote the deformation of body 32 in a direction generally perpendicular to an axis of elongation of the body. Specifically, as described above with respect to FIG. 2, reliefs 34 are used to create deformation zones 38. In these deformation zones 38, portions of body 32 on opposite sides of reliefs 34 will tend to bow in the indicated outward direction, increasing the width of body 32, in response to a sufficiently large compressive force acting along the axial direction of body 32.

FIGS. 4-7 illustrate an exemplary embodiment of an LRU retaining chassis which may be used in, for example, cooling system 10 shown in FIGS. 1A and 1B. Embodiments of this LRU retaining chassis may utilize one or more linear bending springs or spring elements, such as those set forth above with respect to FIGS. 2 and 3. FIG. 8 illustrates an LRU retaining chassis according to FIGS. 4-7 installed within an exemplary cooling system.

Figure 4:
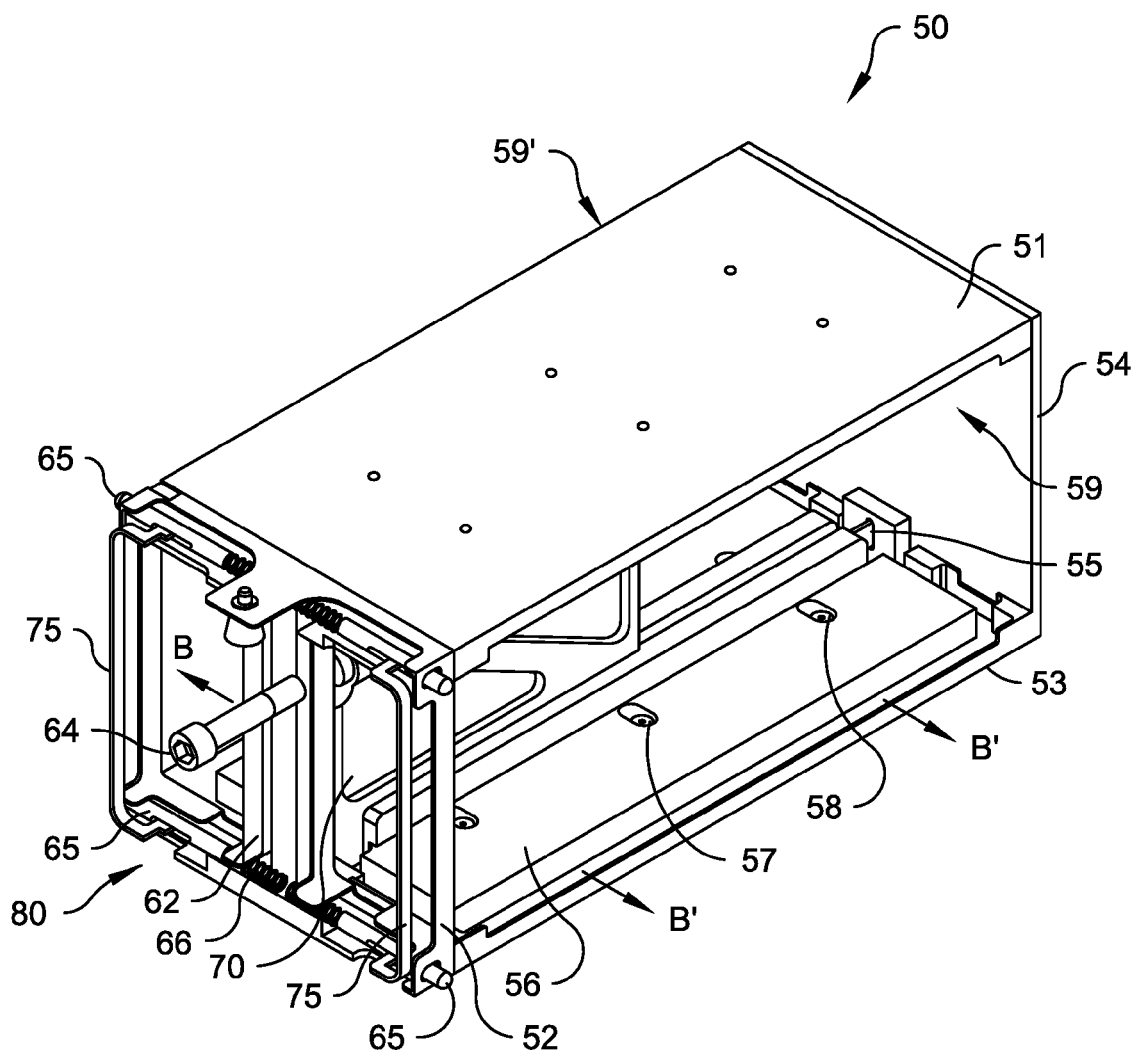
FIG. 4 is an isometric view of an assembled an LRU retaining chassis according to an embodiment of the present disclosure.
Figure 5:
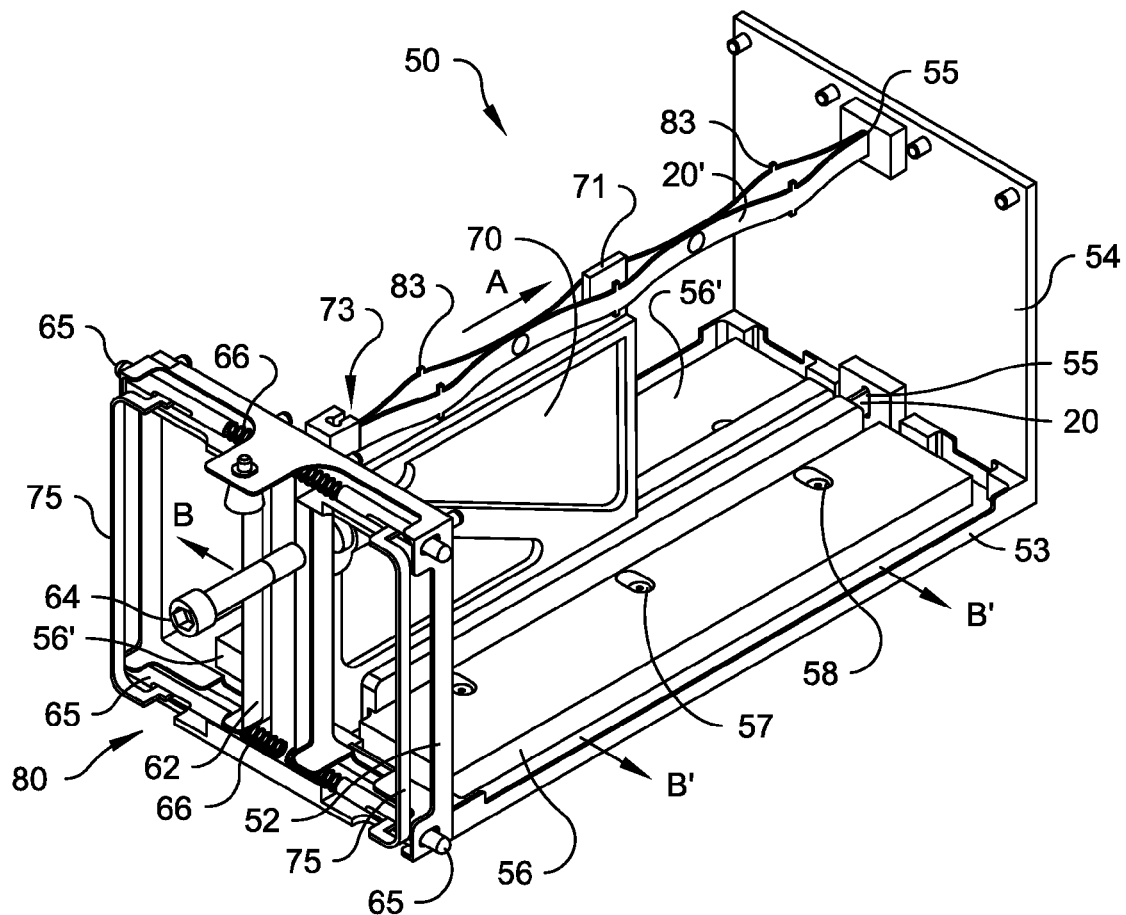
FIG. 5 is an isometric view of a partially-assembled LRU retaining chassis according to the embodiment of FIG. 4 shown in a first, or disengaged position.
Figure 6:
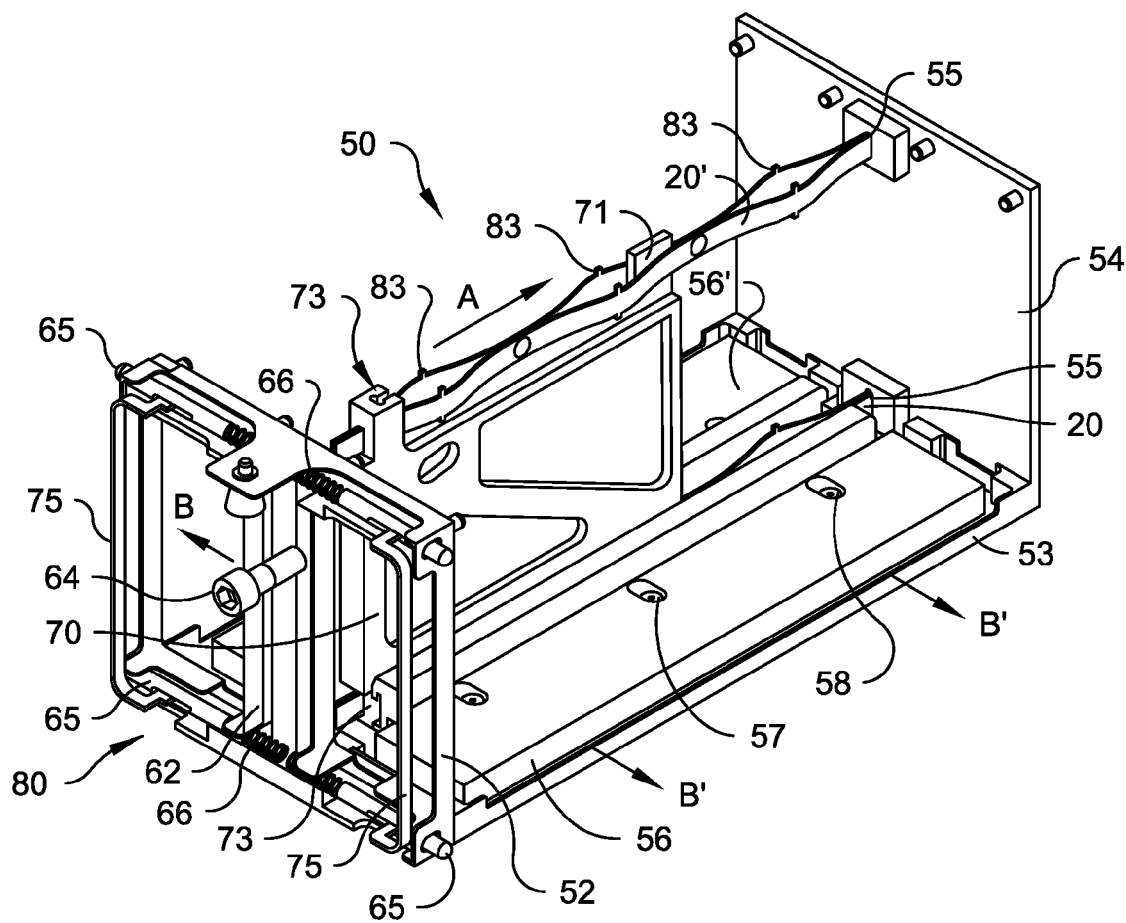
FIG. 6 is an isometric view of the partially-assembled LRU retaining chassis according to the embodiment of FIGS. 4 and 5 shown in a second, or engaged position.
Figure 7:
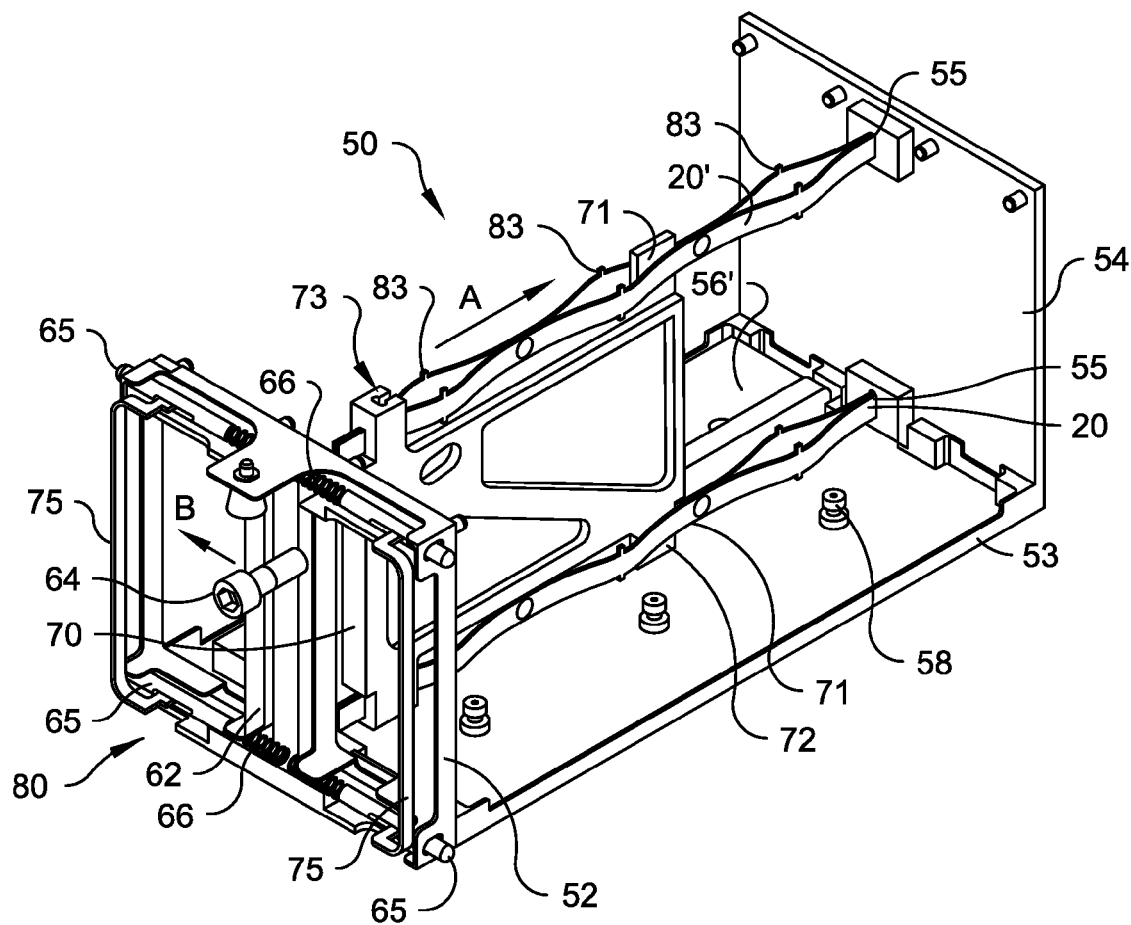
FIG. 7 is an isometric view of a partially-assembled LRU retaining chassis according to the embodiment of FIGS. 4-6.
Figure 8:
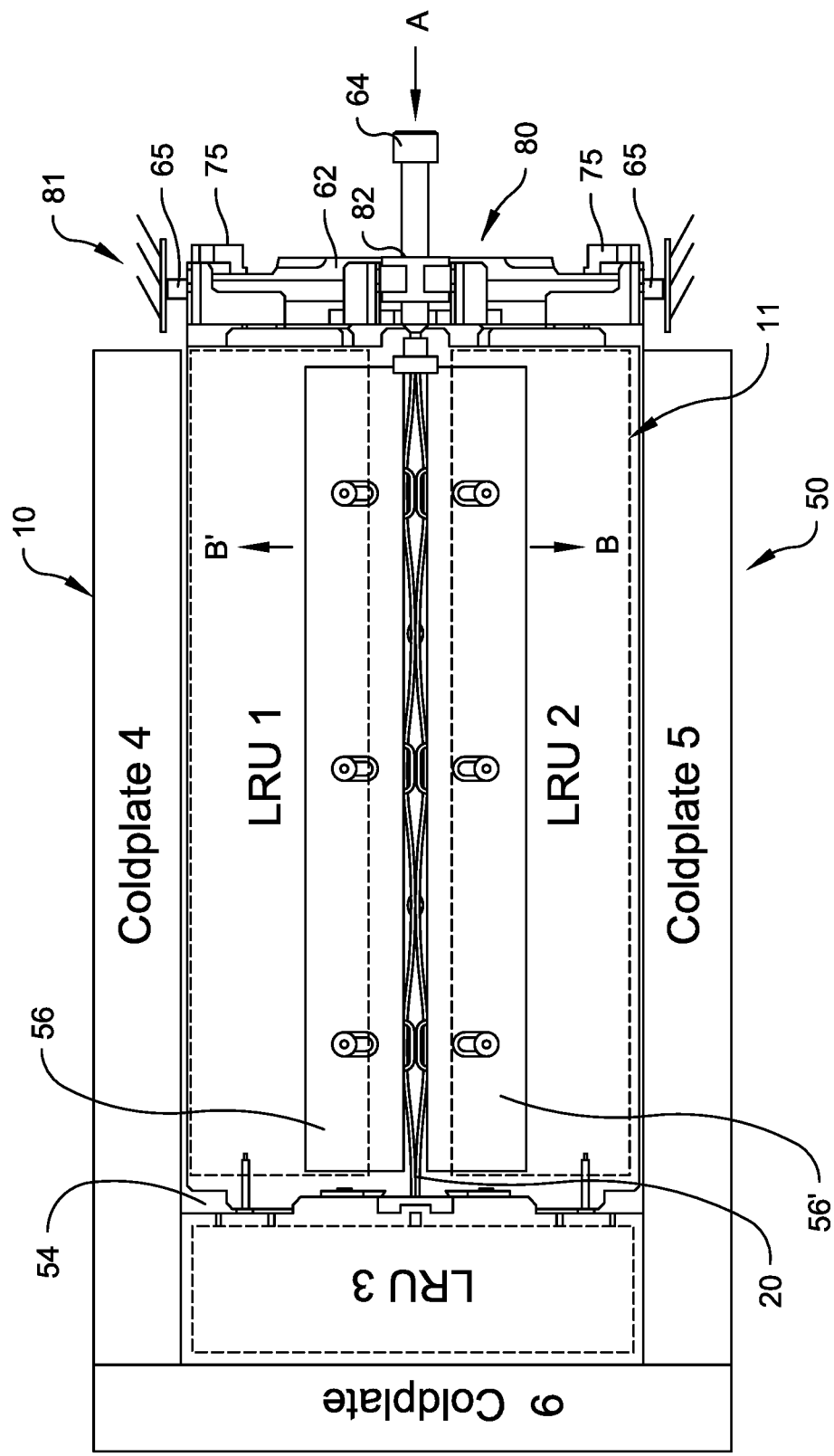
FIG. 8 is a cross section view of a simplified LRU retaining chassis according to an embodiment of the present disclosure.

Referring generally to FIGS. 4-8, an LRU retaining chassis 50 according to an embodiment of the present disclosure includes a frame defined by an upper base 51 and a lower base 53 (upper base 51 has been removed from FIGS. 5-7 for clarity). A front frame member 52 is fixedly attached to upper and lower bases 51,53 at a first end of chassis 50. A rear frame member or rear wall 54 is fixedly attached to upper and lower bases 51,53 at a second end of chassis 50. First and second lower LRU carriages 56,56' are moveably (e.g. slideably) mounted to lower base 53. In one embodiment, this may be achieved via slotted apertures 57 formed in each carriage 56,56' and accompanying fasteners 58 passing through each slotted aperture 57 and securing to lower base 53. As will be set forth in greater detail, each lower LRU carriage 56,56' is configured to be moveable between a first position, for example, as illustrated in FIGS. 4 and 5, and a second position, as illustrated in FIG. 6. Spring element 20 is used to bias carriages 56,56' outward in the directions B,B' indicated (i.e. generally perpendicularly with respect to an axis of elongation of spring element 20). While not visible in the figures, embodiments of the LRU retaining chassis also include upper LRU carriages 59,59' slideably mounted to an underside of upper base 51 in a manner similar to that set forth above with respect to carriages 56,56'. LRU carriages 59,59' are also selectively biased outwards by a second spring element 20'. In use, a respective LRU (e.g. LRU 1,2, FIGS. 1A, 1B, and 8) is configured to be held between each upper and lower LRU carriage pair (e.g. an LRU arranged between lower carriage 56 and upper carriage 59, and an LRU arranged between lower carriage 56' and upper carriage 59').

Referring to FIGS. 5-8, a second end of each spring element 20,20' is mounted to or otherwise supported by rear frame member 54 of LRU retaining chassis 50. In the exemplary embodiment, ends of spring elements 20,20' are inserted into respective apertures 55 formed in rear frame member 54, preventing movement of the ends of springs elements 20,20' with respect thereto. First ends of springs 20,20' are attached to a spring bearing plate 70. In the illustrated embodiment, spring bearing plate 70 includes apertures 73 formed therein into which first ends of spring elements 20,20' are inserted for securing springs 20,20' to spring bearing plate 70. Spring bearing plate 70 may further comprise protrusions 71 formed thereon for engaging with corresponding slotted apertures 72 formed in each of upper and lower bases 51,53 (see FIG. 7, wherein lower carriage 56 has been removed for clarity). In this way, spring bearing plate 70 is slideably mounted between upper and lower bases 51,53, such that it can be moved along the longitudinal or axial direction A of LRU retaining chassis 50 and/or spring elements 20,20'.

LRU retaining chassis 50 further comprises a system for generating, applying and maintaining a force on spring bearing plate 70 in the longitudinal direction A. In the illustrated embodiment, force generation system or assembly 80 includes a front bracket 62. Front bracket 62 is configured to be fixedly mounted to an external structure 81 (FIG. 8). Front bracket 62 may comprise a threaded aperture 82 formed therethrough configured to accept a threaded element 64. As threaded element 64 is threaded through bracket 62, it contacts a bearing surface formed on spring bearing plate 70. Thus, threaded element 64 is configured to selectively engage with and apply a force on spring bearing plate 70 in the axial direction A. While the illustrated embodiments utilize threaded element 64 and corresponding threaded aperture 82, other types engagement elements may be used to selectively generate and maintain a force on spring bearing plate 70 in the axial direction A without departing from the scope of the present disclosure.

Front bracket 62 may be selectively mounted to external environment 81 via, for example, spring-biased pins 65. Specifically, four pins 65 may be biased in an expanded or engaged position via force placed thereon by springs 66. First and second actuating handles 75 are provided, and attached to pins 65. In this way, releasably securing front bracket 62 and LRU retaining chassis 50 to a cooling system may include applying a force on each actuating handle 75, compressing springs 66, and biasing pins 65 into a disengaged position. LRU retaining chassis 50 may then be inserted into an aperture of a cooling system (e.g. aperture 11 of FIGS. 1A, 1B and 8 of cooling system 10). Once inserted, actuating handles 75 may be released, allowing pins 65 to be biased outwardly via springs 66. Pins 65 may engage corresponding apertures formed in external environment 81 such that front bracket 62 is fixed in position with respect to the cooling system.

Front bracket 62 may be moveably or slideably mounted to front frame member 52. In one embodiment, this is achieved via the use of slotted apertures formed in frame member 52 through which pins 65 are inserted. In this way, the entire LRU retaining chassis 50, including front frame member 52, upper and lower bases 51,53, rear frame member 54, spring bearing plate 70, spring elements 20,20' and LRU carriages 56,56',59,59' are moveable in the direction A with respect to front bracket 62 when front bracket 62 is fixedly mounted to external environment 81.

Once LRU retaining chassis 50 is installed into a cooling system (see FIG. 8), threaded element 64 may be rotated with respect to front bracket 62 such that it is threaded further into LRU retaining chassis 50. As threaded element 64 bears on spring bearing plate 70, LRU retaining chassis 50 is biased in a like-direction, urging LRU 3 into contact with a cooling surface of cold plate 6. As LRU 3 abuts cold plate 6, continued axial translation of threaded element 64 will urge spring bearing plate 70 in the axial direction A, compressing spring elements 20,20'. Spring elements 20,20' will begin to elastically deform, increasing their width as set forth herein. This deformation results in the generation of lateral forces on upper and lower LRU carriages 56,56',59, 59', urging LRUs 1,2 into contact with respective cooling surfaces of lateral cold plates 4,5.

Figure 9:
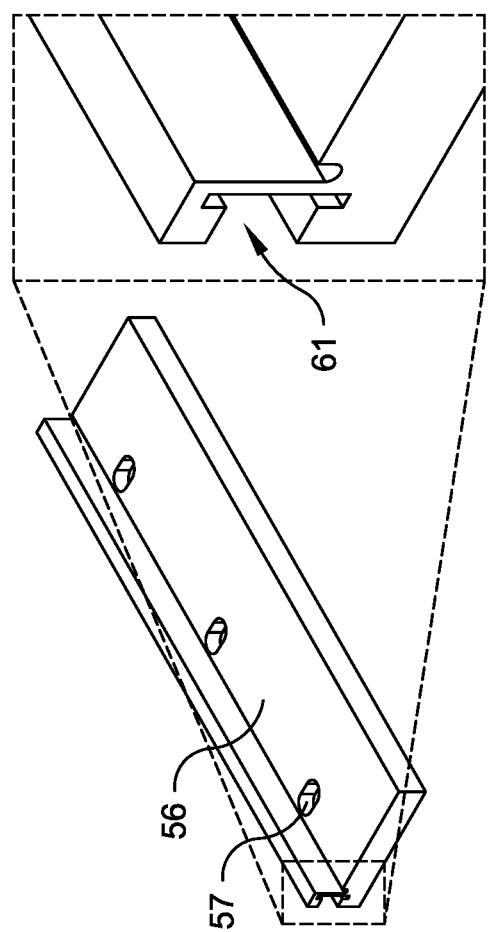
FIG. 9 is an isometric view of an LRU carriage according to an embodiment of the present disclosure.

LRU carriages 56,56',59,59' may be attached directly to springs 20,20'. For example, as illustrated in FIG. 9, an exemplary LRU carriage 56 may comprise a slotted aperture 61 configured to engage with tabs or protrusions 83 (see FIGS. 5-7) formed on each of spring elements 20,20' in the deformation areas. In this way, when the compressive force placed on springs 20,20' is removed/absent (e.g. as would occur during removal of an LRU retaining chassis 50 from cooling system 10), and the deformation zones collapse, LRU carriages 56,56',59,59' will be pulled back toward the position illustrated in FIGS. 4 and 5, thereby removing each of LRUs 1,2 from contact with a respective cold plate 4,5, and enabling LRU retaining chassis 50 to be removed from cooling system 10.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A system for selectively engaging a plurality of electronics modules with respective cooling surfaces of a cooling system comprising:
    a frame;
    a spring element having a first end and a second end, the second end supported by the frame; and
    a force generation system for selectively applying and maintaining a force on the first end of the spring element in a first direction,
    wherein the spring element, in response to said application of force, is configured to compress in length and expand in width for urging each of the plurality of electronics modules into contact with a respective cooling surface of the cooling system.

2. The system of claim 1, wherein the spring element, in response to said application of force, is configured to generate:
    a first force for urging a first electronics module in the first direction;
    a second force for urging a second electronics module in a second direction; and
    a third force for urging a third electronics module in a third direction.

3. The system of claim 2, wherein second direction is generally perpendicular to the first direction, and wherein the third direction is generally opposite the second direction.

4. The system of claim 2, wherein the force generation system comprises:
    a bracket including a threaded aperture, the bracket configured to be fixedly mounted to the cooling system and moveably mounted with respect to the frame; and
    a threaded element for engaging with the threaded aperture of the bracket, the threaded element moveable between a first disengaged position and a second engaged position, wherein in the second engaged position, the threaded element applies the force on the spring element.

5. The system of claim 4, wherein the force generation system further comprises a spring bearing plate attached to the spring element, and wherein the threaded element applies the force on the spring element via the spring bearing plate.

6. The system of claim 5, wherein the spring bearing plate is slideably mounted to the frame.

7. The system of claim 6, wherein the bracket is mounted to a first end of the frame.

8. The system of claim 7, wherein the frame supports the spring element on a second end thereof, opposite the first end.

9. The system of claim 8, wherein the frame defines first and second openings configured to receive the second and the third electronics modules.

10. The system of claim 9, wherein the third electronics module is configured to be attached to the second end of the frame.

11. The system of claim 10, further comprising:
a first carriage mounted to the frame for supporting the second electronics module;
a second carriage mounted to the frame for supporting the third electronics module,
wherein the first and second carriages are moveable between respective first disengaged positions when no force is applied on the spring element by the force generation system, and second engaged positions when the force is applied on the spring element by the force generation system.

12. The system of claim 11, wherein the frame comprises an end member attached to the second end thereof and defining:
an interior side on which the second end of the spring element is supported; and
an exterior side, opposite the interior side, on which the first electronics module is configured to be attached.

13. A cooling system for a plurality of electronics modules comprising:
a first heat sink defining a first cooling surface;
a second heat sink defining a second cooling surface, the second cooling surface oriented generally parallel to and opposing the first cooling surface of the first heat sink;
a third heat sink defining a third cooling surface, the third cooling surface oriented generally perpendicular to the first cooling surface and the second cooling surface, wherein the first cooling surface, the second cooling surface and the third cooling surface at least partially define an opening; and
an electronics module retaining chassis configured to be removably inserted into said opening, comprising:
a frame for at least one of housing and supporting a first electronics module, a second electronics module, and a third electronics module;
a spring element supported within the frame; and
a force generation system for selectively applying a force on the spring element,
wherein the spring element, in response to said application of force, is configured to generate:
a first force for urging said first electronics module in a first direction into said first cooling surface of said first heat sink;
a second force for urging said second electronics module in a second direction into said second cooling surface of said second heat sink; and
a third force for urging said third electronics module in a third direction into said third cooling surface of said third heat sink.

14. The system of claim 13, wherein the electronics module retaining chassis further comprises:
a first carriage for supporting the first electronics module;
a second carriage for supporting the second electronics module,
wherein the first and second carriages are moveable between respective first disengaged positions when no force is applied on the spring element by the force generation system, and second engaged positions when the force is applied on the spring element by the force generation system.

15. The system of claim 14, wherein the spring element is attached on a first side thereof to the first carriage and attached on a second side thereof to the second carriage such that:
an expansion of a width of the spring element is operative to bias the first and second carriages toward respective second positions, and
a reduction in the width of the spring element is operative to bias the first and second carriages toward respective first positions.

16. The system of claim 15, wherein the frame comprises an end member defining:
an interior side on which a second end of the spring element is supported; and
an exterior side on which the third electronics module is configured to be attached,
wherein the force generation system is configured to apply a force on a first end of the spring element.

17. A system for selectively engaging a plurality of electronics modules with a respective heat sink comprising:
a spring element; and
a force generation system for selectively applying a force on the spring element,
wherein the spring element, in response to said force, is configured to generate:
a first resultant force on a first electronics module in a first direction generally parallel to the direction of said force applied by the force generation system;
a second resultant force on a second electronics module in a second direction, the second direction different from the first direction; and
a third resultant force on a third electronics module in a third direction, the third direction generally opposite that of the second direction.

18. The system of claim 17, wherein the spring element, in response to said force, is configured to compress in length and expand in width, and wherein the second and third resultant forces are associated with the expansion of the width of the spring element.

19. The system of claim 17, further comprising an electronics module retaining chassis for at least one of housing and supporting the first electronics module, the second electronics module and the third electronics module.

20. The system of claim 19, wherein the electronics module retaining chassis comprises:
a frame member for supporting the first electronics module;
a first carriage for supporting the second electronics module; and
a second carriage for supporting the third electronics module,
wherein the first and second carriages are moveable between respective first disengaged positions when no force is applied on the spring element by the force generation system, and second engaged positions when the force is applied on the spring element by the force generation system.

* * * * *